(12) United States Patent
Luo et al.

(10) Patent No.: US 7,442,619 B2
(45) Date of Patent: Oct. 28, 2008

(54) METHOD OF FORMING SUBSTANTIALLY L-SHAPED SILICIDE CONTACT FOR A SEMICONDUCTOR DEVICE

(75) Inventors: Zhijiong Luo, Carmel, NY (US); Huilong Zhu, Poughkeepsie, NY (US); Yung Fu Chong, Singapore (SG); Hung Y. Ng, New Milford, NJ (US); Kern Rim, Yorktown Heights, NY (US); Nivo Rovedo, LaGrangeville, NY (US)

(73) Assignees: International Business Machines Corporation, Armonk, NY (US); Chartered Semiconductor Manufacturing Ltd., Singapore (SG)

( * ) Notice: Subject to any disclaimer, the term of this patent is extended or adjusted under 35 U.S.C. 154(b) by 235 days.

(21) Appl. No.: 11/383,965

(22) Filed: May 18, 2006

(65) Prior Publication Data
US 2007/0267753 A1 Nov. 22, 2007

(51) Int. Cl.
*H01L 21/283* (2006.01)
*H01L 23/482* (2006.01)

(52) U.S. Cl. .................. 438/430; 438/666; 438/682; 257/E23.011

(58) Field of Classification Search .............. 257/382, 257/383, 384, 768, 769, 770, 773, 775, E23.011, 257/E29.112, E29.116, E29.117, E29.118, 257/E29.119, E29.12, E29.121, E29.122; 438/300, 665, 666, 682, 685, 686, 218, 219, 438/221, 294, 295, 296, 424, 430
See application file for complete search history.

(56) References Cited
U.S. PATENT DOCUMENTS

| | | | |
|---|---|---|---|
| 5,780,348 A * | 7/1998 | Lin et al. ................ | 438/303 |
| 5,913,124 A * | 6/1999 | Lin et al. ................ | 438/302 |
| 6,017,801 A * | 1/2000 | Youn ...................... | 438/296 |
| 6,133,105 A | 10/2000 | Chen et al. | |
| 6,265,302 B1 | 7/2001 | Lim et al. | |
| 6,649,489 B1 | 11/2003 | Chang et al. | |
| 6,667,204 B2 | 12/2003 | Kim | |
| 6,847,086 B2 | 1/2005 | Kim | |
| 7,227,224 B2 * | 6/2007 | Ko et al. ................. | 257/330 |
| 2007/0138570 A1 * | 6/2007 | Chong et al. ............ | 257/371 |

* cited by examiner

*Primary Examiner*—Lynne A. Gurley
*Assistant Examiner*—Andrew O. Arena
(74) *Attorney, Agent, or Firm*—Rosa S. Yaghmour; Hoffman Warnick LLC

(57) ABSTRACT

A method of manufacturing a semiconductor device having a substantially L-shaped silicide element forming a contact is disclosed. The substantially L-shaped silicide element, inter alia, reduces contact resistance and may allow increased density of CMOS circuits. In one embodiment, the substantially L-shaped silicide element includes a base member and an extended member, wherein the base member extends at least partially into a shallow trench isolation (STI) region such that a substantially horizontal surface of the base member directly contacts a substantially horizontal surface of the STI region; and a contact contacting the substantially L-shaped silicide element. The contact may include a notch region for mating with the base member and a portion of the extended member, which increases the silicide-to-contact area and reduces contact resistance. Substantially L-shaped silicide element may be formed about a source/drain region, which increases the silicon-to-silicide area, and reduces crowding and contact resistance.

2 Claims, 6 Drawing Sheets

METHOD OF FORMING SUBSTANTIALLY L-SHAPED SILICIDE CONTACT FOR A SEMICONDUCTOR DEVICE

BACKGROUND OF THE INVENTION

1. Technical Field

The invention relates generally to a method of fabricating a semiconductor device, and more particularly, to fabricating a device having a substantially L-shaped silicide element to form a contact to, inter alia, reduce contact resistance and increase circuit density.

2. Background Art

With the aggressive scaling of complementary metal oxide semiconductor (CMOS) technology, it becomes increasingly challenging to keep miniaturizing the dimensions of components while avoiding the adverse effects brought on by scaling. In other words, increasing the density of structures on an integrated circuit becomes increasingly challenging due to the adverse effects. One adverse effect brought on by scaling is increased contact resistance. A contact is an electrically conductive connector between layers of an integrated circuit (IC). Increased contact resistance may be caused by decreased area between silicon and a silicide adjacent a transistor in which a contact is to be formed, or by reduced area between the silicide and the contact. The increased contact resistance and the related structural density issues may pose a challenge to further scaling.

In view of the foregoing, there is a need in the art for a solution to the problems of the related art.

SUMMARY OF THE INVENTION

A structure, semiconductor device and method having a substantially L-shaped silicide element for a contact are disclosed. The substantially L-shaped silicide element, inter alia, reduces contact resistance and may allow increased density of CMOS circuits. In one embodiment, the structure includes a substantially L-shaped silicide element including a base member and an extended member, wherein the base member extends at least partially into a shallow trench isolation (STI) region such that a substantially horizontal surface of the base member directly contacts a substantially horizontal surface of the STI region; and a contact contacting the substantially L-shaped silicide element. The contact may include a notch region for mating with the base member and a portion of the extended member, which increases the silicide-to-contact area and reduces contact resistance. Substantially L-shaped silicide element may be formed about a source/drain region, which increases the silicon-to-silicide area, and reduces crowding and contact resistance.

A first aspect of the invention provides a structure for a semiconductor device, the structure comprising: a substantially L-shaped silicide element including a base member and an extended member, wherein the base member extends at least partially into a shallow trench isolation (STI) region such that a substantially horizontal surface of the base member directly contacts a substantially horizontal surface of the STI region; and a contact contacting the substantially L-shaped silicide element.

A second aspect of the invention provides a method of forming a contact for a semiconductor device, the method comprising the steps of: providing a structure for the semiconductor device having an interface between a source/drain region and an isolation region; removing a portion of the interface to create an edge on the source/drain region; forming a substantially L-shaped silicide element including a base member and an extended member about the edge, the base member extending at least partially into the isolation region such that a substantially horizontal surface of the base member directly contacts a substantially horizontal surface of the isolation region; and forming the contact connected to the substantially L-shaped silicide element.

A third aspect of the invention provides a semiconductor device comprising: a transistor having a source/drain region and an isolation region adjacent thereto, the isolation region having a spacer that only partially covers the isolation region; a substantially L-shaped silicide element extending about the source/drain region, the substantially L-shaped silicide element including a base member and an extended member, the base member directly contacting the spacer on the isolation region; and a contact including a notch region for mating with the base member and a portion of the extended member.

The illustrative aspects of the present invention are designed to solve the problems herein described and/or other problems not discussed.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Figure 1:
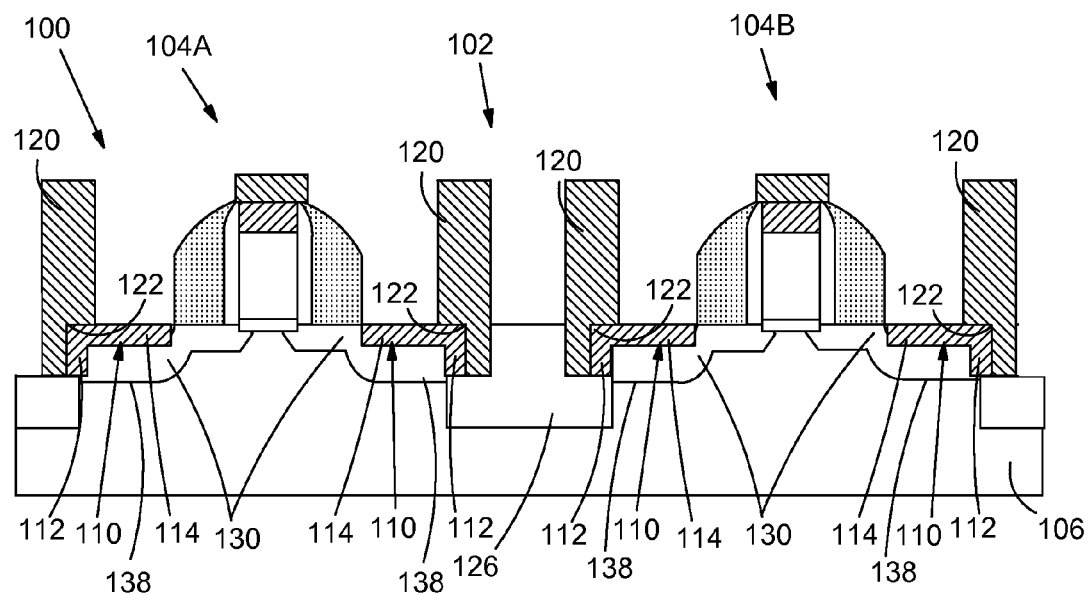
FIG. 1 shows a first embodiment of a substantially L-shaped silicide element according to the invention.

Referring to FIG. 1, one embodiment of a structure 100 for a semiconductor device 102 according to the invention is shown. Semiconductor device 102 is shown including a transistor 104A, 104B (two shown), but it should be recognized that the teachings may be applied in different settings within semiconductor device 102. Each transistor 104A, 104B includes a source/drain region 130, i.e., a source region and a drain region. Transistors 104A and 104B are built on semiconductor substrate 106 such as bulk silicon (Si), silicon on insulator (SOI), or other materials. In addition, an isolation region 126, e.g., a shallow trench isolation (STI) region, is provided adjacent to each transistor 104A, 104B for isolating transistors 104A, 104B. Isolation region 126 may include, for example, silicon dioxide ($SiO_2$). Source/drain region 130 may include an extension region (not numbered), if desired.

Figure 2:
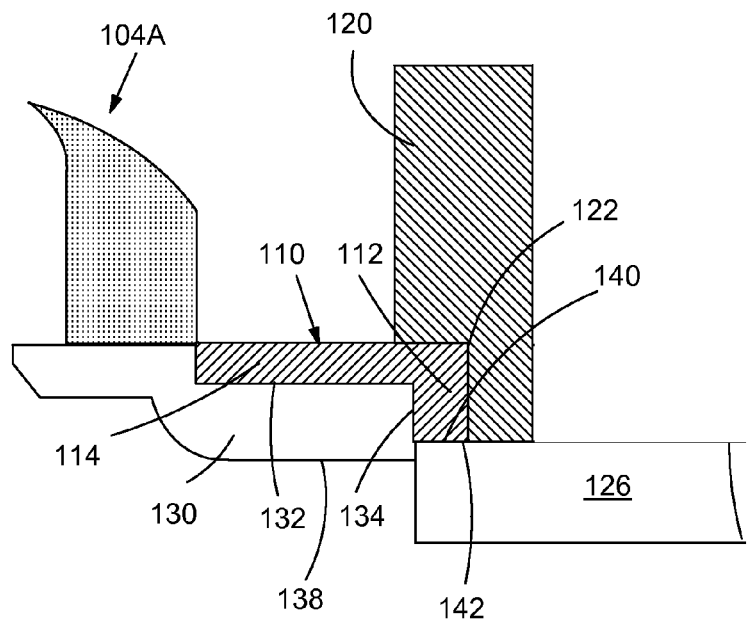
FIG. 2 shows a detail of FIG. 1.

As shown in FIGS. 1 and 2, structure 100 (FIG. 1) includes a substantially L-shaped silicide element 110 (hereinafter "silicide element 110") including a base member 112 and an extended member 114, and a contact 120 contacting silicide element 110. As used herein, "substantially L-shaped" indicates that element 110 has base member 112 and extended member 114 that meet somewhere about, but not necessarily exactly at, about a 90 degree angle. For example, the substantially L-shape may be between about 80 degrees and about 120 degrees. Silicide element 110 may include any now known or later developed silicide material, e.g., nickel silicide, cobalt silicide, tungsten silicide, titanium silicide, etc., and contact 120 may include any conductive material now known or later developed for interlayer contacts, e.g., tungsten. Contact 120 includes a notch region 122 for mating with base member 112 and a portion of extended member 114, which increases the silicide-to-contact area and reduces contact resistance.

Referring to FIG. 2, in which details of silicide element 110 are shown, silicide element 110 extends about source/drain region 130 of transistor 104A, 104B, i.e., it contacts a substantially horizontal surface 132 and a substantially vertical surface 134 of source/drain region 130. Base member 112 extends at least partially into isolation region 126 between transistors 104A, 104B (latter not shown in FIG. 2). Furthermore, base member 112 may extend at least partially into isolation region 126 such that a substantially horizontal surface 140 of base member 112 directly contacts a substantially horizontal surface 142 of isolation region 126, i.e., there is no other material between base member 112 and isolation region 126. The above-described arrangement increases the silicon-to-silicide area, and reduces crowding. In one embodiment, base member 112 may extend at least partially into silicon of source/drain region 130 to a depth that is shallower than a depth of a source/drain junction 138, i.e., where the source and drain region cease to exist in the silicon. Since silicide element 110 is recessed into isolation region 126, it allows for increased density for structures during further scaling of CMOS devices.

Figure 3:
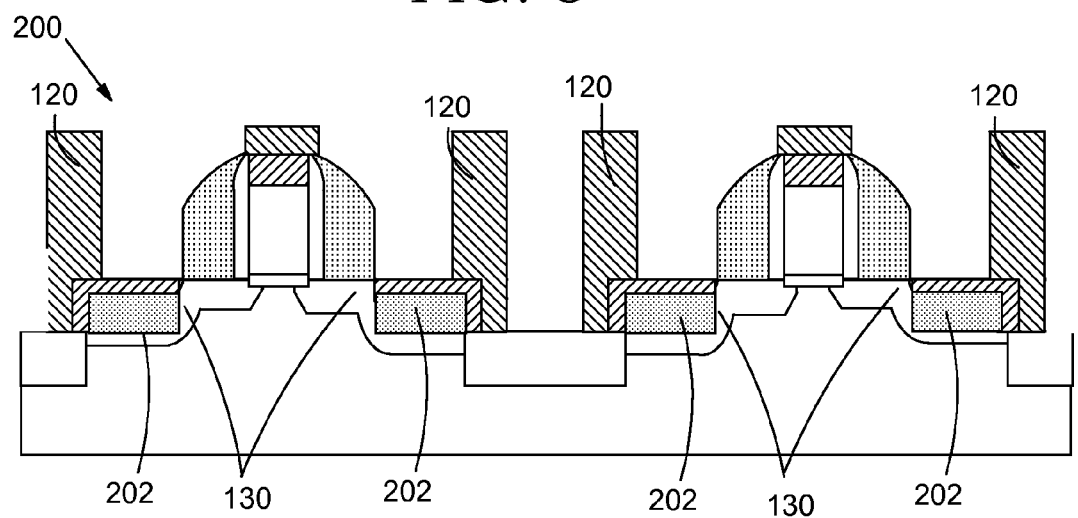
FIG. 3 shows an alternative embodiment of a substantially L-shaped silicide element according to the invention.

Turning to FIG. 3, in an alternative embodiment, a structure 200 may also include a member 202. Member 202 may include, for example, a (embedded) silicon-germanium member 202 formed within source/drain region 130 for a P-type metal oxide semiconductor field effect transistor (MOSFET) or a (embedded) silicon-carbon member 202 formed within source/drain region 130 for an N-type MOSFET. Other embodiments of device 102 (FIG. 1) will be described below relative to methods of forming contact 120 for semiconductor device 102.

Figure 4:
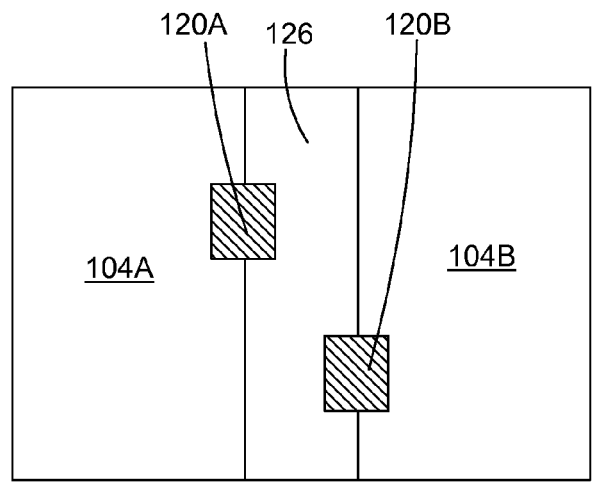
FIG. 4 shows a top view of a layout of contacts according to one embodiment of the invention.

Since the density of semiconductor devices 102, e.g., transistors 104A, 104B, may be increased using structures 100, 200, it may be necessary to accommodate contacts 120 spacing in other than a standard arrangement. To this end, as shown in FIG. 4, in another alternative embodiment, where a plurality of contacts 120A, 120B are provided, they may be staggered relative to one another along isolation region 126. That is, a first contact 120A for a first transistor 104A is staggered relative to an adjacent, second contact 120B for a second transistor 104B along isolation region 126.

Figure 5:
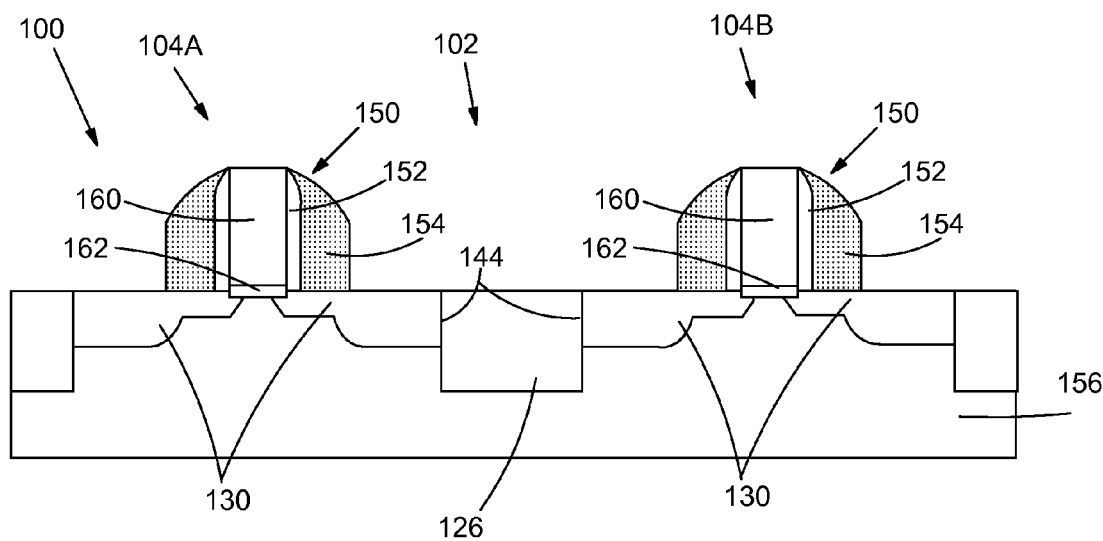
FIGS. 5, 6, 8 and 10 show steps of one embodiment of a method of forming a contact according to the invention.

Turning to FIGS. 1 and 5-11, various embodiments of a method of forming contact 120 for semiconductor device 102 will now be described. It is understood, however, that the above-described structures 100, 200 may be formed in a variety of ways, which are considered within the scope of the invention. As shown in FIG. 5, a first step includes providing semiconductor device 102 having an interface 144 between source/drain region 130 and isolation region 126. In addition, the initial structure may include at least one transistor device 104A, 104B including, for example, a gate 150, surrounded by, for example, an inner 152 and outer spacer 154. Source/drain region 130 ion implantation and annealing within a silicon substrate 156 has been completed at this stage. Also, isolation region(s) 126 are formed to separate different transistor devices 104A, 104B. Gate 150 may include a polysilicon body 160 and a gate dielectric region 162, e.g., of silicon oxide. As illustrated, transistors 104A, 104B are field effect transistors (FETs).

Figure 6:
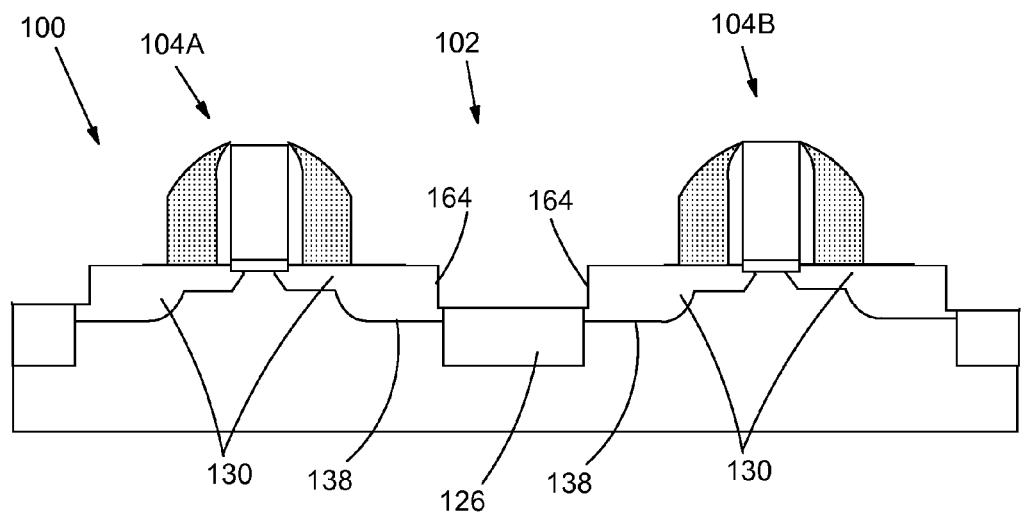

Next, as shown in FIG. 6, a portion of interface 144 (FIG. 5) is removed to create an edge 164 on source/drain region 130. That is, part of source/drain region 130 and isolation region 126 are recessed. This step may include performing a wet etch or reactive ion etch (RIE) or other etching processing for recessing isolation region 126 and part of source/drain region 130. Note, in some cases, it may be only necessary to recess isolation region 126 to form edge 146 without any recessing of source/drain region 130. In any event, interface 144 (FIG. 5) is only removed to a depth that is shallower than a depth of a source/drain junction 138, i.e., where the source and drain region cease to exist in the silicon.

Figure 7:
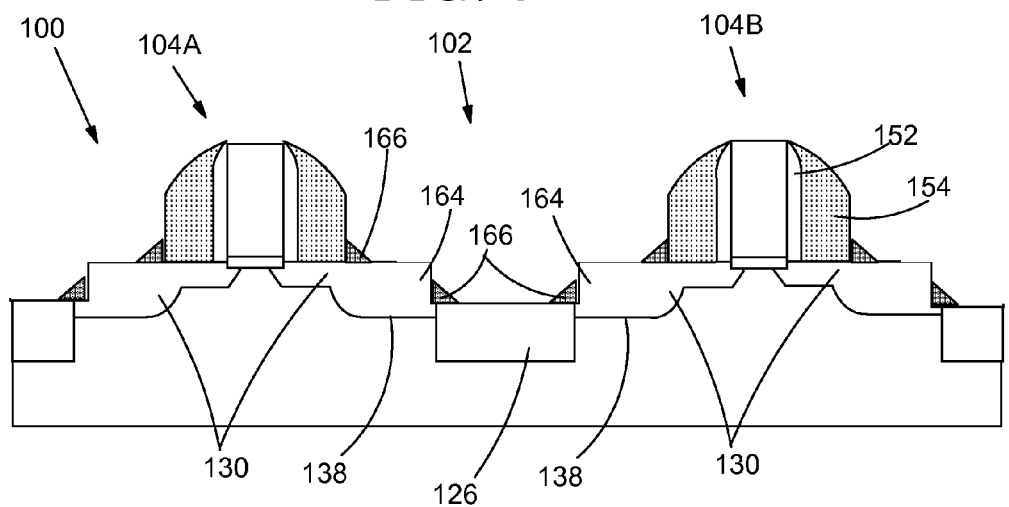
FIGS. 7, 9 and 11 shows steps of another embodiment of a method of forming a contact according to the invention.

FIG. 7 shows an optional step in which an additional spacer 166 is formed to reduce the risk of an increase in junction leakage current. Additional spacer 166 may include any now known or later developed spacer material such as silicon nitride. Additional spacer 166 is formed about a spacer 152, 154 of transistors 104A, 104B and on isolation regions 126. Additional spacer 166, however, only fills a corner between isolation region 126 and source/drain region 130, i.e., it extends only partially over isolation region 126. Note, additional spacer 166 is not shown in other figures, except FIGS. 9 and 11.

Figure 8:
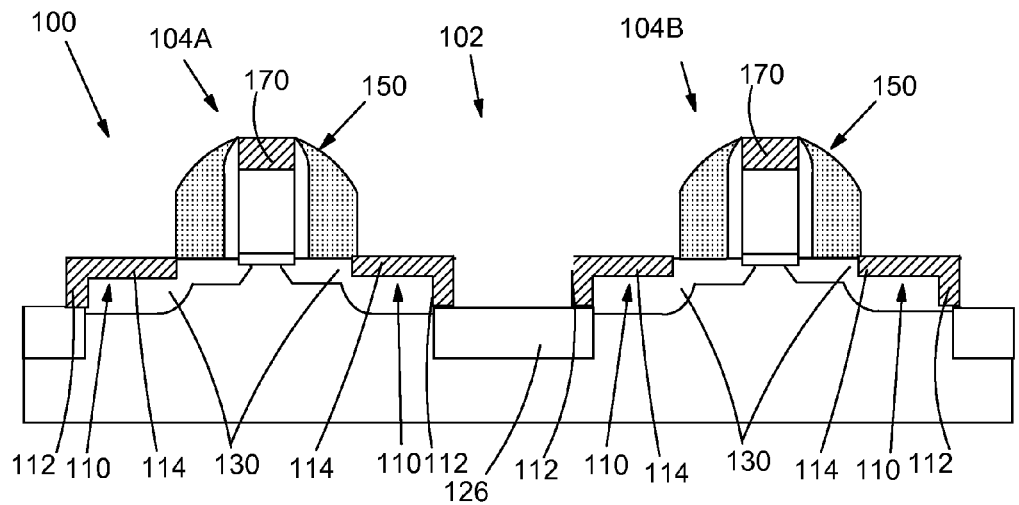
Figure 9:
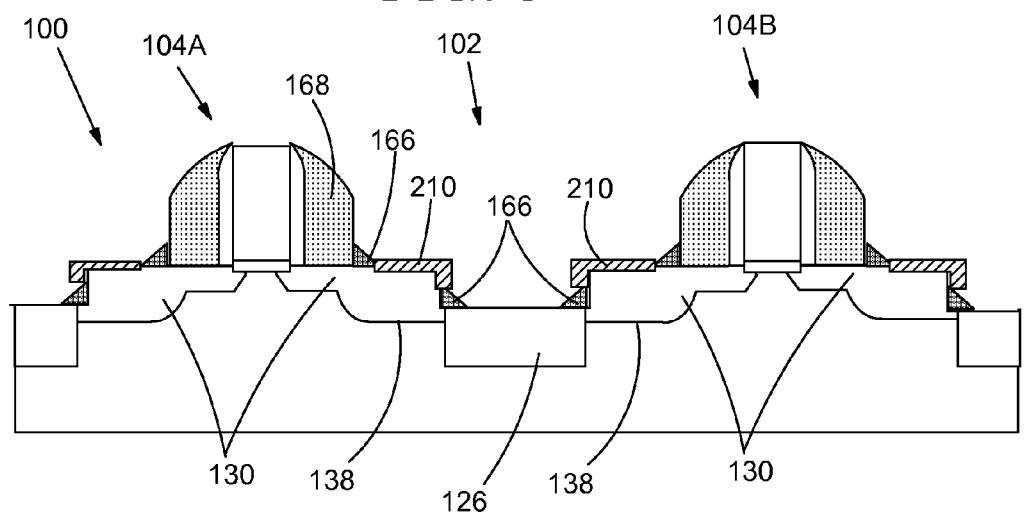

As shown in FIG. 8, a next step includes forming substantially L-shaped silicide element 110 including base member 112 and extended member 114 about edge 146. As noted above, base member 112 may extend at least partially into isolation region 126 (once re-formed, as described below) such that substantially horizontal surface 140 (FIG. 2) of base member 112 directly contacts substantially horizontal surface 142 (FIG. 2) of isolation region 126. This step may include depositing a metal, e.g., nickel, cobalt, tungsten, titanium, etc., to form the appropriate precursor for the desired silicide, and annealing to form the silicide on edge 164 (FIG. 6). The result is substantially L-shaped silicide element 110. In addition, gate 150 may be provided with a silicide cap 170 at this stage. FIG. 9 shows substantially L-shaped silicide element 210 formed on the structure shown in FIG. 7, i.e., with additional spacer 166.

Figure 11:
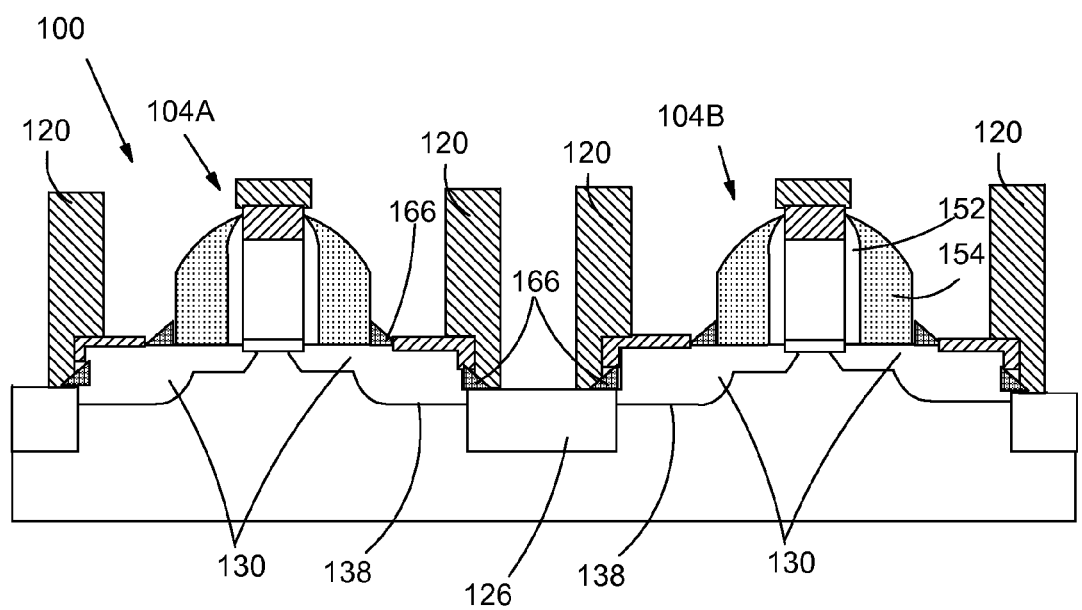

Next, returning to FIG. 1, one or more contacts 120 are formed such that they each connect to silicide element 110. This step may include any now known or later developed processes for forming a contact 120 such that contact 120 includes a notch region 122 for mating with base member 112 and a portion of extended member 114. Although shown as such, contact 120 need not extend the entire length of base member 112. As described relative to FIG. 4, this step may also include forming a plurality of contacts 120A, 120B such that a first contact 120A for a first transistor 104A is staggered relative to an adjacent, second contact 120B for a second transistor 104B along isolation region 126. Subsequent processing may include re-forming isolation region 126 to its original surface such that base member 112 extends into isolation region 126, but this is not necessary. FIG. 11 shows contacts 120 applied to the embodiment of FIGS. 7 and 9. In this embodiment, base member 112 (FIG. 1) directly contacts additional spacer 166 on isolation region 126, and contact 120 contacts isolation region 126 adjacent to additional spacer 166.

Figure 10:
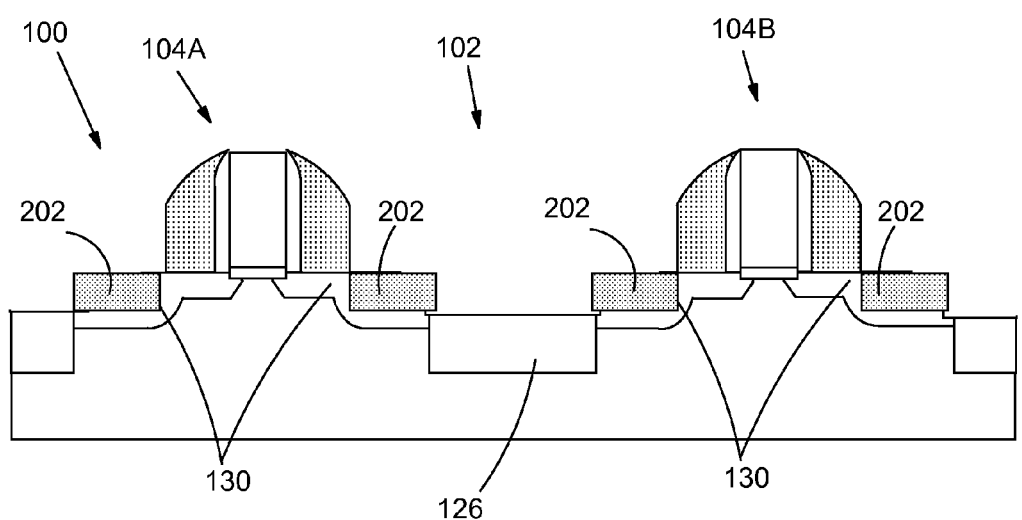

FIG. 10 shows an alternative embodiment of the above-described method. In this embodiment, an initial structure for the above-described method includes member 202, i.e., a silicon germanium member for a P-type MOSFET or a silicon carbon member for an N-type MOSFET. In this case, any now known or later developed processing for forming embedded member 202 in source/drain region 130 may be employed. As shown in FIG. 10, conventional processes typically result in a recessed isolation region 126 such that the above-described removing step may be provided as part of forming member 202 in source/drain region 130 prior to forming silicide element 110. Note, also the embodiment of FIG. 11 may also include member 202.

Contact resistance is proportional to the contact area on the first order. Therefore, using the sidewall of an isolation region (e.g., STI) to increase the total contact area allows reduction of the contact resistance, and provides a smaller area for source/drain regions of the FET for contact, which can increase circuit density.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A method of forming a contact for a semiconductor device, the method comprising:
    providing a structure for the semiconductor device having an interface between a source/drain region and an isolation region;
    removing a portion of the interface to create an edge on the source/drain region;
    forming a substantially L-shaped silicide element including a base member and an extended member about the edge, the base member extending at least partially into the isolation region such that a substantially horizontal surface of the base member directly contacts a substantially horizontal surface of the isolation region;
    forming the contact connected to the substantially L-shaped silicide element,
    wherein the contact forming includes forming the contact including a notch region for mating with the base member and a portion of the extended member; and
    re-forming the isolation region to its original surface height such that the base member extends into the isolation region;
    wherein the removing is provided as part of a step of forming a member over the source/drain region prior to the substantially L-shaped silicide element forming step, the member including a silicon-germanium member for a P-type semiconductor device or a silicon carbon member for an N-type semiconductor device, and
    wherein the removing step includes removing the interface to a depth that is shallower than a source/drain junction depth.

2. The method of claim 1, wherein the contact forming includes forming a plurality of contacts such that a first contact for a first transistor is staggered relative to an adjacent, second contact for a second transistor along the isolation region.

* * * * *